United States Patent [19]
Runas

[11] Patent Number: 5,596,291
[45] Date of Patent: Jan. 21, 1997

[54] CIRCUITS, SYSTEMS AND METHODS FOR THE HIGH SPEED TRANSFER OF DATA ACROSS A CONDUCTIVE LINE

[75] Inventor: Michael E. Runas, McKinney, Tex.

[73] Assignee: Cirrus Logic, Inc., Fremont, Calif.

[21] Appl. No.: 641,708

[22] Filed: May 2, 1996

Related U.S. Application Data

[63] Continuation of Ser. No. 418,649, Apr. 10, 1995, abandoned.

[51] Int. Cl.$^6$ .................................................... H03K 5/153
[52] U.S. Cl. .............................................. 327/108; 327/77
[58] Field of Search ...................................... 327/77–8, 108

[56] References Cited

U.S. PATENT DOCUMENTS

| | | | |
|---|---|---|---|
| 4,486,670 | 12/1984 | Chen et al. | 307/264 |
| 4,943,740 | 7/1990 | Gulczynski | 327/108 |
| 4,978,870 | 12/1990 | Chen et al. | 307/475 |
| 5,285,115 | 2/1994 | Tsuji | 327/77 |
| 5,329,171 | 7/1994 | Shimizu et al. | 327/78 |
| 5,369,319 | 11/1994 | Good et al. | 327/77 |
| 5,399,913 | 3/1995 | Widener et al. | 327/108 |

*Primary Examiner*—Margaret Rose Wambach
*Attorney, Agent, or Firm*—Winstead Sechrest & Minick, P.C.

[57] ABSTRACT

Circuitry 200 is provided for transferring data across a conductive line 201. A driver 202 is provided for transmitting data across the line 201, the driver 202 receiving data at a first high voltage level and a low voltage level and driving the line 201 at the low voltage level and a second high voltage level, the second high voltage level being less than the first high voltage level. A receiver 206 is provided for receiving data transmitted on line 201 by driver 202. The receiver includes a differential amplifier 207–210 having a first input coupled to line 201 and a second input coupled to a voltage source providing a reference voltage $V_{ref}$. Receiver 206 further includes a current source transistor 212 for coupling a common node 213 of the differential amplifier to a source providing a voltage at the first high voltage level, the differential amplifier outputting data at said low voltage level and said first high voltage level.

20 Claims, 1 Drawing Sheet

CIRCUITS, SYSTEMS AND METHODS FOR THE HIGH SPEED TRANSFER OF DATA ACROSS A CONDUCTIVE LINE

This is a continuation of application Ser. No. 08/418,649 filed Apr. 10, 1995, now abandoned.

TECHNICAL FIELD OF THE INVENTION

The present invention relates in general to electronic circuits and systems and in particular to circuits, systems and methods for the high speed transfer of data across a conductive line.

BACKGROUND OF THE INVENTION

In designing high performance integrated circuits, the need to transfer addresses and data across a bus at high speed is a critical consideration. This is especially true in applications where a memory and a high performance state machine are being integrated into a single chip. One such instance is when a display controller and a frame buffer are being integrated to produce a single-chip display control device. In this case, substantial amounts of data, and the corresponding addresses, must be transferred between the graphics controller and the frame buffer at rates high enough to support display refresh and update, and other processing operations, such as filtering. As display systems with increased resolution and bit depths are developed, the rate at which data must be transferred between the controller and the frame buffer consequently increases. While some of the necessary bandwidth can be achieved by using wider buses, improvement in the speed at which data is transferred over the individual bus lines is still required.

The lines of a typical on-chip bus are long, thin conductors which extend relatively substantial lengths across the face of the substrate, the substrate spacing each conductor from the chip ground plane. As a result of this configuration, each line presents a significant capacitance which must be charged or discharged by a bus driver or similar circuit during data transmission. The result is substantial power consumption, particularly when the driver is driving the bus line towards the positive voltage supply rail to transmit logic high data.

The power consumption resulting from bus line capacitance increases directly with the data transmission rate across the bus since $P=CV^2f$, where P is the power loss through each conductor, V is the voltage applied, C is the capacitance of the conductor, and f is the frequency at which the conductor is charged/discharged. It should also be noted that some additional small power consumption results from the resistance of each bus line.

It is possible to reduce power consumption by reducing the capacitance of the bus lines themselves. This option however requires that the fabrication process for the chip be modified; a change in process to reduce line capacitance is expensive and may adversely effect the fabrication of other circuitry on the chip. Another option is to reduce the frequency at which data is transferred across the bus. Assuming that the width of the bus is not increased, this option simply trades off system performance for power reduction, an option which usually is not viable in the design and implementation of high performance circuits.

Thus, the need has arisen for improved circuits, systems and methods for transferring data and/or addresses across the lines of a bus at high rates. Such circuits, systems and methods should advantageously minimize power consumption and the problems attendant therewith. In particular, such circuits, systems and methods should be applicable to high performance integrated circuit applications, such as when a display controller and frame buffer are integrated on a single chip. Finally, such circuits, systems and methods should require neither expensive and complicated changes to the chip fabrication process nor a reduction in system performance for implementation.

SUMMARY OF THE INVENTION

The principles of the present invention are generally embodied in circuits and systems in which logic high data is transferred over a given conductive line at a voltage substantially less than the voltage used in conventional bus/line driver schemes to transfer logic high data. Logic low data continues to be transferred over the given line at approximately zero volts or ground. At the receiving end of the bus, the logic high data is returned to the conventional logic high voltage levels. In this fashion, substantial power reduction can be achieved while still maintaining high data transfer rates.

According to one embodiment of the present invention, circuitry is provided for transferring data across a conductive line. A driver is included for driving data across the conductive line, the driver receiving data at a first high voltage level and a low voltage level and driving the line at the low voltage level and a second high voltage level, the second high voltage level being less than the first high voltage level. A receiver is provided for receiving data transmitted on the line by the driver, the receiver including a differential amplifier and a current source transistor. The differential amplifier has a first input coupled to the conductive line and a second input coupled to a reference voltage. The current source transistor couples a common node of the differential amplifier to a voltage source providing a voltage at the first high voltage level, the differential amplifier outputting data at the low voltage level and the first high voltage level.

Another embodiment is a receiver for receiving data transmitted on a conductive line. A differential amplifier is included having a first input for coupling to a conductive line and a second input coupled to a reference voltage, the reference voltage substantially equivalent to one-half of a voltage representing logic high data being transmitted on the line. A current sourcing transistor supplies current to the differential amplifier, the transistor biased by a bias voltage to set an operating point voltage of the differential amplifier at approximately the reference voltage. A switching transistor is provided for selectively coupling the current sourcing transistor with a supply voltage rail, the rail providing a voltage greater than the voltage of the logic high data being transmitted on the line.

The principles of the present invention are further embodied in an integrated circuit having at least some circuitry therein operating in response to a preselected supply voltage. The integrated circuit includes first and second blocks of circuitry, a bus having a data line for transferring data between those blocks, a driver for driving data across the line and a receiver for receiving data transferred on the line. The driver in a first logic state pulls the line to a first preselected fraction of the supply voltage and in a second logic state pulls the line to substantially zero volts. The receiver includes a differential amplifier having a first input coupled to the line and a second input coupled to a reference voltage, the reference voltage being a second preselected fraction of the supply voltage. The receiver also includes a transistor coupling the differential amplifier to a source of the supply voltage.

The principles of the present invention are additionally embodied in methods for transferring data across a conductive line. According to one such method, data is driven across the line in a first logic state by pulling the line to a preselected fraction of a supply voltage and in a second logic state by pulling the line to substantially zero volts. The data is then received at the first input of a differential amplifier, a second input of the differential amplifier being coupled to a reference voltage less than the preselected fraction of the supply voltage. The differential amplifier is supplied with the supply voltage through a transistor biased to set the operating point of the differential amplifier at approximately the reference voltage. Logic high data is output from the differential amplifier at a voltage substantially equal to the supply voltage.

Circuits, systems and methods embodying the principles of the present invention have substantial advantages over prior art techniques for transferring data across bus lines at high rates. In particular, the principles of the present invention allow for the minimization of power consumption, and the problems attendant with power consumption, without requiring changes to the chip fabrication processes or a reduction in system performance. In particular, these circuits, systems and methods are advantageously applied to display control systems in which substantial amounts of data and corresponding addresses must be transferred between the frame buffer and the controller.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
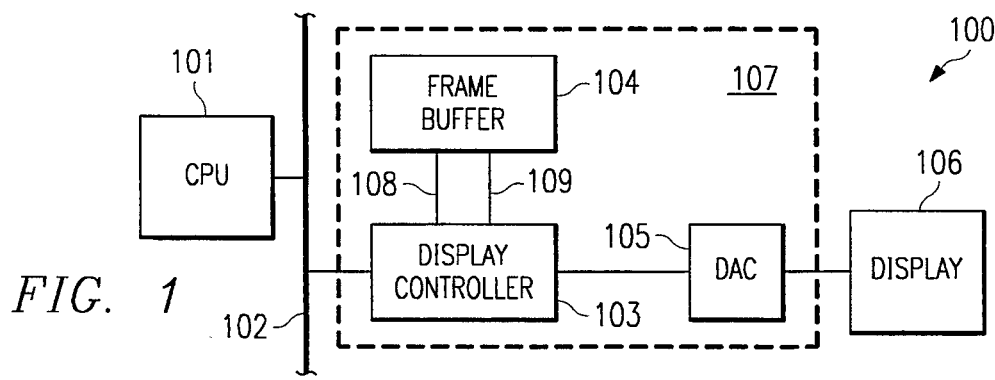
FIG. 1 is a functional block diagram of a display control system.
Figure 2:
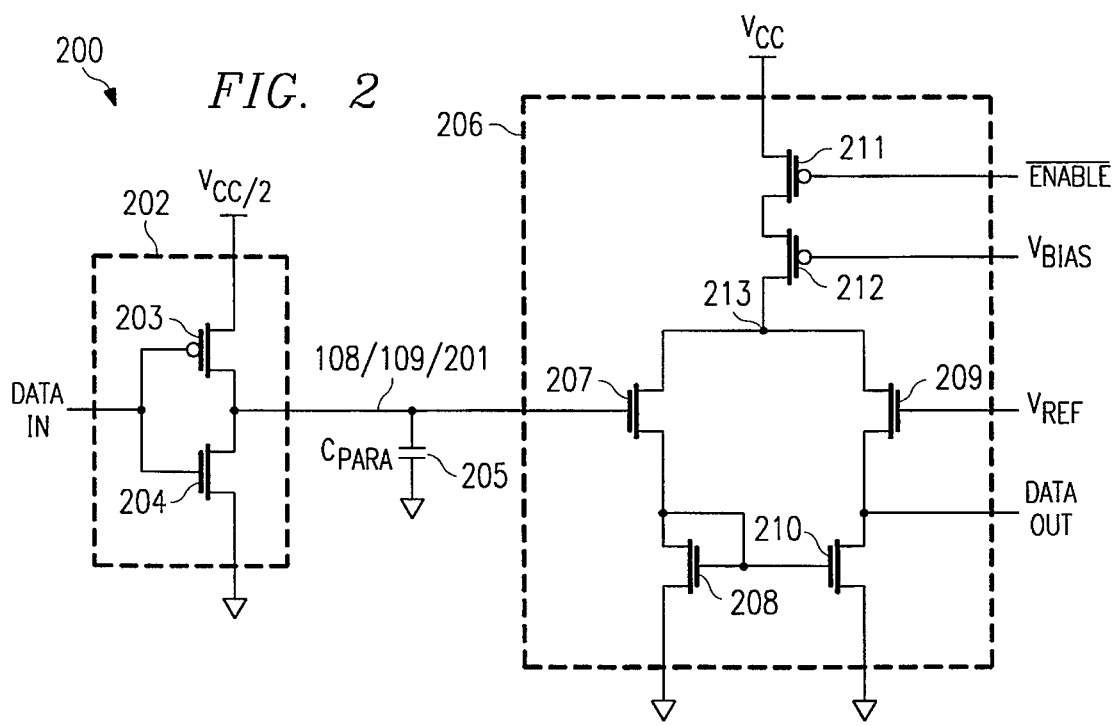
FIG. 2 is an electrical schematic diagram of bus line driver/receiver circuitry embodying the principles of the present invention, the circuitry of FIG. 2 suitable for transferring data across address and data buses coupling the display controller and frame buffer of the system illustrated in FIG. 1.
Figure 3:
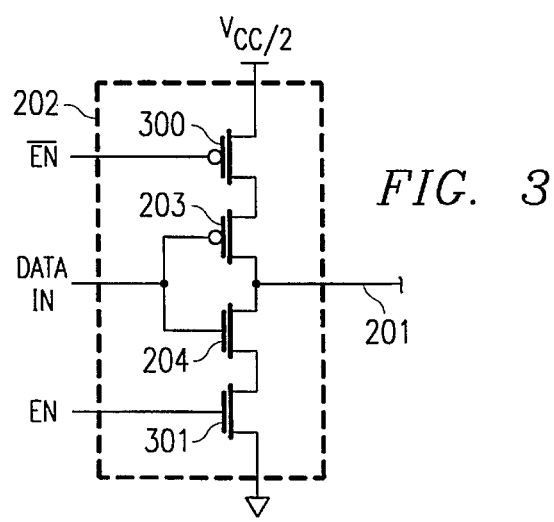
FIG. 3 is an electrical schematic diagram of a second embodiment of the bus line driver circuitry of FIG. 2.

The principles of the present invention and their advantages are best understood by referring to the illustrated embodiment depicted in FIGS. 1–3 of the drawings, in which like numbers designate like parts. For purposes of illustration, the principles of the present invention will be described as may be implemented in a display system frame buffer although these principles may be applied to a number of different data processing circuits and systems as will become apparent from the discussion below.

FIG. 1 is a high level functional block diagram of the portion of a processing system 100 controlling the display of graphics and/or video data. System 100 includes a central processing unit 101, a system bus 102, a display controller 103, a frame buffer 104, a digital to analog converter (DAC) 105 and a display device 106. Display controller 103, frame buffer 104 and DAC 105 may be fabricated together on a single integrated circuit chip 107 or on separate chips. Display controller 103 and frame buffer 104 are coupled by an address bus 108 and an associated data bus 109 constructed in accordance with the principles of the present invention.

CPU 101 controls the overall operation of system ("master") 100, determines the content of graphics data to be displayed on display unit 106 under user commands, and performs various data processing functions. CPU 101 may be for example a general purpose microprocessor used in commercial personal computers. CPU 101 communicates with the remainder of system 100 via system bus 102, which may be for example a local bus, an ISA bus or a PCI bus. DAC 105 receives digital data from display controller 103 and outputs in response the analog data required to drive display 106. Depending on the specific implementation of system 100, DAC 105 may also include a color palette, YUV to RGB format conversion circuitry, and/or x- and y-zooming circuitry, to name a few options.

Display 106 may be for example a CRT unit or liquid crystal display, electroluminescent display (ELD), plasma display (PLD), or other type of display device which displays images on a display screen as a plurality of pixels. It should also be noted that in alternate embodiments, "display" 106 may be another type of output device such as a laser printer or similar document view/print appliance.

FIG. 2 is an electrical schematic diagram of bus driver/receiver circuitry 200 for transmitting data across a transmission line, such as a given line 201 of address bus 108 or data bus 109. In FIG. 2, the selected line 201 is assumed to be unidirectional for discussion purposes. An alternate embodiment for transferring data across a bidirectional bus, such as data bus 109, is discussed below in conjunction with FIG. 3. It should be noted that in system 100, driver/receiver circuitry 200 could also be applied to the transmission of data and/or addresses between bus 102 and display controller 103, between display controller 103 and DAC 105, or between DAC 105 and display 106, to name only a few examples.

Transmission of data onto bus line (conductor) 201 is accomplished in the illustrated embodiment through an inverting bus driver 202 including a p-channel transistor 203 and an n-channel transistor 204. Output high voltage drive is provided in the preferred embodiment from a supply voltage rail at a voltage of $V_{CC}/2$, where $V_{CC}$ in the illustrated embodiment is the supply voltage for integrated circuit 107. For a CMOS embodiment, $V_{CC}$ may be for example +5 V or +3.3 V. In alternate embodiments, bus driver 202 may be a non-inverting driver operating from a $V_{CC}/2$ voltage rail and/or may further implement a selected logic function (e.g., AND, OR, NAND, NOR, etc.).

In the illustrated embodiment, transistors 203 and 204 drive (charge/discharge) a parasitic capacitance $C_{para}$ on bus line 210, which is represented in FIG. 2 by a capacitor 205. Capacitance $C_{para}$ is assumed to have an approximate value of 2 pf for illustrative purposes. The value of $C_{para}$ will vary from physical embodiment to physical embodiment and will depend on such factors as the length and width of the conductor and the spacing from the ground plane.

Reception of data from bus 201 is accomplished through bus receiver circuitry 206 which includes n-channel transistors 207–210 and p-channel transistors 211 and 212. In the preferred embodiment, bus receiver 206 operates from a voltage rail at the full chip supply voltage $V_{CC}$. In the illustrated embodiment, where driver 202 is an inverting circuit, receiver circuitry 206 also inverts to return the data transmitted by driver circuitry 202 back to the status received at driver 202 input DATA IN. Similarly, in alternate embodiments where driver circuitry 202 is a non-inverting driver, receiver circuitry 206 is likewise a non-inverting circuit.

Transistors 207–210 form a differential amplifier. The gate of transistor 207 provides one differential amplifier input to receiver 206 and is coupled to bus line 201. The other differential amplifier input is provided by the gate of transistor 209 and is coupled to a reference voltage $V_{REF}$. The node 213 formed by the drains of transistors 207 and 209 (the "common node" for reference) is coupled to a current sourcing transistor 212 which is controlled by a bias voltage $V_{bias}$ applied at the transistor 212 gate. Transistor 211 allows receiver circuitry 206 to be selectively enabled and disabled in response to control signal $\overline{ENABLE}$. Preferably, transistors 208 and 210 are matched as a current mirror and conduct equal currents when turned on.

According to the principles of the present invention, reference voltage $V_{ref}$ is set at approximately $V_{CC}/4$ (i.e., approximately one-half of the $V_{CC}/2$ voltage rail from which driver 202 operates). Control signal $\overline{ENABLE}$ is set low when data is being received and set high otherwise. Bias voltage $V_{bias}$ is selected to set the common mode operating point of the differential amplifier; the more current flow provided through transistor 212, the more speed is achievable. Preferably, the common mode operating point is set by $V_{bias}$ at a voltage approximately equal to $V_{ref}$.

During operation, inverting driver circuitry 202 receives data at input DATA IN at the conventional CMOS logic voltage levels (e.g. approximately 5 volts for high voltage CMOS and approximately 3.3 volts for low voltage CMOS). When logic high (logic 1) data is received, line 201 is pulled to approximately zero (0) volts by transistor 204. When logic low (logic 1) data is received, line 201 is pulled to approximately $V_{CC}/2$ volts by transistor 203. By driving bus at $V_{CC}/2$ instead of at the full $V_{CC}$ voltage level, the power consumption for a given frequency and line capacitance is reduced in accordance with the formula $P=CV^2f$, discussed above. In the illustrated embodiment where the logic high voltage driving bus line 201 is approximately half that used in conventional circuits, the power consumption is reduced approximately by a factor of four.

Receiver 206 receives data from line 201 by sensing the voltage difference between the voltage on line 201 and the reference voltage $V_{ref}$. As discussed above, transistor 212 is a current source, transistors 207 and 209 are a differential pair, and transistors 208 and 210 form a current mirror load for the differential pair. The operation of receiver 206 can be described through a discussion of its three possible operating states.

In the first state, the voltage at the gate of transistor 207 is equal to $V_{ref}$ at the gate of transistor 209. In the normal operation of receiver 206 this state would only occur if the voltage on line 201 is driven at the reference voltage $V_{ref}$. In this case, the currents through transistors 207 and 209 (the differential pair) are substantially equal. Similarly, the currents through transistors 208 and 210 (the current mirror) are also substantially equal. As a result, the voltage at the output DATA OUT is approximately equal to zero, assuming minimal current leakage through the output loading (not shown) on output DATA OUT.

In the second state, the voltage at the gate of transistor 207 is greater than the reference voltage $V_{ref}$ (i.e. line 201 is carrying logic high data). Since the current though source transistor 212 is equal to the total current through transistors 207 and 209 combined, the current through transistor 207 increases with respect to the current through transistor 209. Further, since the current through transistor 207 is increased, the current through transistor 208 also increases. The increased current through transistor 208 is mirrored in transistor 210. The extra current transistor 210 is sinking is drawn from the loading on output DATA OUT, and consequently, the output voltage at DATA OUT is pulled down.

In the third state, the voltage at the gate of transistor 207 is less than the reference voltage $V_{ref}$ (i.e. line 201 is carrying logic low data). Again, the current though source transistor 212 is equal to the total current through transistors 207 and 209 combined. Thus, with the voltage at the gate of transistor 207 being less than $V_{ref}$ at the gate of transistor 209, the current through transistor 207 decreases with respect to the current through transistor 209. Consequently, the current through transistor 208 decreases. Due to mirroring, the current through transistor 210 also decreases. The excess current from transistor 209 is injected to the load on DATA OUT and the output voltage accordingly increases. The output voltage is dependant on the loading; assuming that the load resistance is very small, the output voltage will approach $V_{CC}$, with some small voltage drops occurring across transistors 209 and 212.

It should be noted that in some applications, such as where the load on output DATA OUT is sensitive to a logic high voltage level, another amplifier stage (not shown) may be provided between DATA OUT and the load. This additional circuitry may be for example a ratioed inverter or the like.

In sum, in accordance with the principles of the present invention, logic high data is transmitted over a given conductive line at a voltage substantially less than the voltage used in conventional bus/line driver schemes to represent logic high data. Logic low data continues to be transmitted over the line at approximately zero volts or ground. At the receiving end of the bus, the logic high data is returned to the conventional logic high voltage levels for further processing. In this fashion; substantial power reduction can be achieved while still maintaining high data transfer rates.

FIG. 3 depicts an alternate embodiment of bus (line) driver circuitry 202 particularly suitable for driving a given line 201 of a bidirectional bus, such as data bus 109 in the illustrated embodiment. In the configuration of FIG. 3, driver circuitry includes transistors 300 and 301 which allow the output of circuitry 202 to be switched into a high impedance state in response to a control signal EN and its complement $\overline{EN}$. In the case of a bidirectional bus line, two drivers circuits 202 and two receiver circuits 206 are employed, one driver 202 and one receiver 206 at each end. Control signal EN is set high for the transmitting driver 202 and is set low for the driver 202 on the receiving end of the line (i.e., such that the output is in a high impedance state).

Control signal $\overline{\text{ENABLE}}$ is set low for the receiving receiver 206 and is set high for the receiver 206 on the transmitting end of the line 201.

Although the present invention and its advantages have been described in detail, it should be understood that various changes, substitutions and alterations can be made herein without departing from the spirit and scope of the invention as defined by the appended claims.

What is claimed is:

1. Circuitry for transferring data across a conductive line comprising:

a driver for transmitting data across said line, said driver receiving data at a first high voltage level and a low voltage level and driving said line at said low voltage level and a second high voltage level generated from a first voltage source, said second high voltage level less than said first high voltage level;

a receiver for receiving data transmitted on said line by said driver, said receiver comprising:

a differential amplifier having a first input coupled to said line and a second input coupled to a voltage source providing a reference voltage; and a current source transistor coupling a common node of said differential amplifier to a second voltage source providing a voltage approximating said first high voltage level, said differential amplifier outputting data at said low voltage level and said first high voltage level.

2. The circuitry for transferring of claim 1 wherein said driver comprises a pair of transistors having current paths coupled in series between a voltage supply providing said second high voltage level and ground, a first one of said transistors being a p-channel transistor and having a source coupled to said supply and a second one of said transistor being an n-channel transistor having a source coupled to ground.

3. The circuitry for transferring of claim 1 wherein said current source transistor comprises a p-channel transistor having a source coupled to said source providing said voltage at said first high voltage level, a drain coupled to said differential amplifier, and a gate coupled to a bias voltage.

4. The circuitry for transferring of claim 3 wherein said bias voltage is selected such that a common mode operating point voltage is approximately equal to said reference voltage.

5. The circuitry for transferring of claim 1 and further comprising a transistor for selectively coupling said current source transistor and said second source of said second voltage in response to an enable signal.

6. The circuitry for transferring of claim 1 wherein said differential amplifier comprises:

a first transistor having a gate coupled to said line and a drain coupled to said current source transistor;

a second transistor having a drain and gate coupled to a source of said first transistor and a source coupled to ground;

a third transistor having a gate coupled to said source of said voltage and a drain coupled to said current source transistor; and a fourth transistor having a drain coupled to coupled to a source of said third transistor, a gate coupled to said gate and drain of said second transistor and a source coupled to ground.

7. The circuitry for transferring of claim 1 wherein said second high level voltage is approximately one-half of said first high level voltage.

8. A receiver for receiving data transmitted on a conductive line, logic high data transmitted on said line represented by a first high voltage level generated from a first voltage source, comprising:

a differential amplifier having a first input for coupling to said conductive line, a second input coupled to a reference voltage, said reference voltage less than said first high voltage representing said logic high data being transmitted on said line, and an output node for outputting logic high data at a second high voltage level greater than said first high voltage level;

a current sourcing transistor supplying current to said differential amplifier, said transistor biased by a bias voltage to set an operating point voltage of said differential amplifier at approximately said reference voltage; and a switching transistor for selectively coupling said current sourcing transistor with a second voltage source, said second source providing a voltage approximating said second high voltage level.

9. The receiver of claim 8 wherein said supply voltage is at least twice that of said voltage of said logic high data on said line.

10. The receiver of claim 8 wherein said current sourcing transistor comprises a p-channel transistor.

11. The receiver of claim 8 wherein said switching transistor comprises a p-channel transistor.

12. The receiver of claim 8 wherein said differential amplifier is constructed of n-channel transistors.

13. The receiver of claim 12 wherein said differential amplifier comprises:

a first transistor having a gate coupled to said line and a drain coupled to said current sourcing transistor;

a second transistor having a drain and a gate coupled to a source of said first transistor and a source coupled to ground;

a third transistor having a gate coupled to said source of said reference voltage and a drain coupled to said current sourcing transistor; and a fourth transistor having a drain coupled to a drain of said third transistor, a gate coupled to said gate and said drain of said second transistor and a source coupled to ground.

14. An integrated circuit, at least some blocks of circuitry forming said integrated circuit operating in response to a preselected supply voltage, comprising:

a bus having a data line for transferring data between selected ones of said blocks of circuitry;

a driver for driving data across said line, said driver in a high logic state pulling said line to a first preselected fraction of said supply voltage and in a low logic state pulling said line to substantially zero volts; and a receiver for receiving data transmitted on said line by said driver, said receiver comprising:

a differential amplifier having a first input coupled to said line, a second input coupled to a reference voltage, said reference voltage being a second preselected fraction of said supply voltage, and an output node for outputting data of of a high logic state at approximately said supply voltage; and a transistor coupling said differential amplifier to a source of said supply voltage.

15. The integrated circuit of claim 14 wherein said second predetermined fraction approximately equals one-half of said first predetermined fraction.

16. The integrated circuit of claim 15 wherein said first predetermined fraction approximately equals one-half of said supply voltage.

17. The integrated circuit of claim 14 wherein said first block of circuitry includes a controller and said second block of circuitry includes a memory.

18. The integrated circuit of claim 17 wherein said controller comprises a display controller and said memory comprises a frame buffer.

19. The integrated circuit of claim 14 wherein a gate of said transistor is biased to set a common mode operating point voltage of said differential amplifier to be approximately said reference voltage.

20. A method for transferring data across a conductive line comprising the steps of:

driving data across the line in a first logic state by pulling the line to a preselected fraction of a supply voltage and in a second logic state by pulling the line to substantially zero volts;

receiving the data at a first input of a differential amplifier, a second input of the differential amplifier coupled to a reference voltage less than the preselected fraction of the supply voltage;

supplying the differential amplifier with the supply voltage through a transistor biased to set the operating point of the differential amplifier at approximately the reference voltage; and outputting logic high data from the differential amplifier at a voltage substantially equal to the supply voltage.

\* \* \* \* \*